(12) United States Patent
Soeno

(10) Patent No.: US 8,723,220 B2
(45) Date of Patent: May 13, 2014

(54) SEMICONDUCTOR DEVICE

(75) Inventor: Akitaka Soeno, Toyota (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 122 days.

(21) Appl. No.: 13/201,791

(22) PCT Filed: Feb. 12, 2010

(86) PCT No.: PCT/JP2010/052488
§ 371 (c)(1),
(2), (4) Date: Aug. 16, 2011

(87) PCT Pub. No.: WO2010/095700
PCT Pub. Date: Aug. 26, 2010

(65) Prior Publication Data
US 2011/0297934 A1    Dec. 8, 2011

(30) Foreign Application Priority Data
Feb. 17, 2009   (JP) ................................ 2009-033688

(51) Int. Cl.
*H01L 29/739*   (2006.01)

(52) U.S. Cl.
USPC .................................. 257/173; 257/E29.201

(58) Field of Classification Search
None
See application file for complete search history.

(56) References Cited

U.S. PATENT DOCUMENTS

| | | | |
|---|---|---|---|
| 4,777,579 A | 10/1988 | Jahns et al. | |
| 4,783,690 A | 11/1988 | Walden et al. | |
| 5,557,128 A | 9/1996 | Yamazaki et al. | |
| 5,559,355 A | 9/1996 | Yamazaki et al. | |
| 5,828,112 A | 10/1998 | Yamaguchi | |
| 6,180,966 B1 * | 1/2001 | Kohno et al. | ............... 257/173 |
| 8,072,241 B2 * | 12/2011 | Kouno | ......................... 326/61 |
| 2005/0017290 A1 | 1/2005 | Takahashi et al. | |
| 2006/0215341 A1 | 9/2006 | Sakurai et al. | |
| 2007/0108468 A1 | 5/2007 | Takahashi | |
| 2007/0126070 A1 * | 6/2007 | Hotta | ......................... 257/414 |

(Continued)

FOREIGN PATENT DOCUMENTS

| | | | |
|---|---|---|---|
| DE | 10 2008 056388 A1 | 5/2009 | |
| JP | 7-245394 A | 9/1995 | |

(Continued)

OTHER PUBLICATIONS

Office Action mailed Jun. 26, 2012 in related Japanese Patent Application No. 2011-222604 & English translation thereof.

(Continued)

*Primary Examiner* — Benjamin Sandvik
(74) *Attorney, Agent, or Firm* — Kenyon & Kenyon LLP

(57) ABSTRACT

A reverse conducting semiconductor device having an IGBT element region and a diode element region in one semiconductor substrate is provided. An electric current detection region is arranged adjacent to the IGBT element region, and a collector region of the IGBT element region is extended to connect with a collector region of the electric current detection region. Instability in the IGBT detection current caused by a boundary portion between the IGBT and the diode can be suppressed. In the same way, an electric current detection region is arranged adjacent to the diode element region, and a cathode region of the diode element region is extended to connect with a cathode region of the electric current detection region. Instability in the diode detection current caused by the boundary portion between the IGBT and the diode can be suppressed.

1 Claim, 10 Drawing Sheets

(56) References Cited

U.S. PATENT DOCUMENTS

| | | | |
|---|---|---|---|
| 2007/0158680 A1 | 7/2007 | Ozeki et al. | |
| 2007/0200138 A1* | 8/2007 | Ozeki et al. | 257/139 |
| 2008/0315248 A1 | 12/2008 | Tokura et al. | |
| 2009/0057832 A1 | 3/2009 | Kouno | |
| 2009/0114947 A1 | 5/2009 | Fukuda | |
| 2012/0217541 A1* | 8/2012 | Hsieh | 257/140 |
| 2013/0009206 A1* | 1/2013 | Soeno | 257/140 |

FOREIGN PATENT DOCUMENTS

| | | |
|---|---|---|
| JP | 9-148579 A | 6/1997 |
| JP | 10-041510 A | 2/1998 |
| JP | 10-41510 A | 2/1998 |
| JP | 10-326897 A | 12/1998 |
| JP | 2001-015750 A | 1/2001 |
| JP | 2004-088001 A | 3/2004 |
| JP | 2006-271098 A | 10/2006 |
| JP | 2007-134625 A | 5/2007 |
| JP | 2009-099690 A | 5/2009 |
| JP | 2009-117786 A | 5/2009 |
| JP | 2012-009900 A | 1/2012 |
| WO | 2007/108456 A1 | 9/2007 |

OTHER PUBLICATIONS

International Search Report and Written Opinion of PCT/JP2010/057814 and English translations thereof.
International Preliminary Report on Patentability of PCT/JP2010/057814.
International Search Report of PCT/JP2010/052488 mailed Dec. 2, 2010 & Written Opinion.
International Preliminary Report on Patentability of PCT/JP2010/052488 issued Jul. 1, 2011.
Office Action mailed on Feb. 21, 2012 in JP 2011-222604 and English translation thereof.
Office Action issued on Aug. 30, 2011 in JP 2009-033688 and English translation thereof.
Office Action issued on Nov. 1, 2011 in JP 2011-222604 and English translation thereof.

* cited by examiner

SEMICONDUCTOR DEVICE

This is a 371 national phase application of PCT/JP2010/052488 filed 12 Feb. 2010, claiming priority to Japanese Patent Application No. JP 2009-033688 filed 17 Feb. 2009, the contents of which are incorporated herein by reference.

TECHNICAL FIELD

The present invention relates to a semiconductor device in which both an insulated gate bipolar transistor (IGBT) element region and a diode element region are formed in one semiconductor substrate.

BACKGROUND ART

For the purpose of protecting against damage due to an overimposed current, etc., a semiconductor device is provided with an electric current detection region to detect electric current flowing through the semiconductor device. Japanese Patent Application Publication No. H7-245394 discloses a semiconductor device having a main active region (main cell region) in which an IGBT is formed, and an electric current detection region (detector cell region) for detecting electric current that flows through the main active region provided in one semiconductor substrate. An IGBT identical to that on the main active region is formed in the electric current detection region, and the electric current detection region is spaced apart from the main active region by 100 μm or more. In this configuration, carrier interference at the boundary region between the electric current detection region and the main active region is prevented, and the electric current ratio between the main electric current flowing through the main active region and the detected electric current flowing through the electric current detection region is maintained substantially constant.

DISCLOSURE OF THE INVENTION

With a reverse conducting semiconductor device in which the IGBT element region and the diode element region are formed in the same semiconductor substrate, a second conductivity type collector region, a first conductivity type drift region, and a second conductivity type body region are sequentially laminated in the IGBT element region, and a first conductivity type cathode region, a first conductivity type drift region, and a second conductivity type body region are sequentially laminated in the diode element region. With this type of semiconductor device, in a case where the electric current detection region is also provided in one semiconductor substrate, if an IGBT identical to that in the IGBT element region is formed in the electric current detection region, IGBT detection electric current flows therethrough, and IGBT main electric current that flows through the IGBT element region can thereby be detected. If a diode identical to that in the diode element region is formed in the electric current detection region, diode detection electric current flows therethrough, and diode main electric current that flows through the diode element region can thereby be detected.

The present inventor discovered that, with this type of semiconductor device, the electric current that flows through the IGBT (the IGBT main electric current) and the electric current that flows through the diode (the diode main electric current) becomes unstable in the boundary portion between the IGBT and diode (i.e., the area around a boundary between the collector region and the cathode region). In other words, the electric current that flows through the IGBT will be affected by the adjacent diode, and the electric current that flows through the diode will be affected by the adjacent IGBT. Because the size of the boundary portion between the IGBT and diode is relatively small with respect to the size of the main active region, even if there is a boundary portion between the IGBT and diode in the main active region, there will be little effect on the IGBT main electric current and the diode main electric current.

However, because the electric current detection region is significantly small compared to the main active region, the electric current detection region is more likely to be affected by the IGBT electric current and the diode electric current being unstable at the boundary portion between the IGBT and the diode. With a reverse conducting semiconductor device in which the IGBT element region and the diode element region are formed in one semiconductor substrate, the position and size of the electric current detection region must be designed with careful considerations to reducing the effect of the boundary portion between the IGBT and the diode.

Disclosed herein is a semiconductor device comprising an IGBT element region, a diode element region, and a first electric current detection region capable of detecting at least an IGBT electric current that flows through the IGBT element region (IGBT main electric current). The IGBT element region, the diode element region, and the first electric current detection region are formed in one semiconductor substrate. A second conductivity type collector region, a first conductivity type drift region, and a second conductivity type body region are sequentially laminated in the IGBT element region. A second conductivity type collector region, a first conductivity type drift region, and a second conductivity type body region are sequentially laminated in at least one portion of the first electric current detection region. A first conductivity type cathode region, a first conductivity type drift region, and a second conductivity type body region are sequentially laminated in the diode element region. The first electric current detection region is arranged adjacent to the IGBT element region, and the collector region of the IGBT element region extends to connect with the collector region of the first electric current detection region.

With this semiconductor device, the first electric current detection region capable of detecting at least the IGBT main electric current is arranged adjacent to the IGBT element region (i.e., the region through which the IGBT main electric current flows), and the collector region of the IGBT element region extends to connect with the collector region of the first electric current detection region. In other words, the collector region of the IGBT element region continues towards the first electric current detection region, and also extends underneath at least a portion of the first electric current detection region. In this configuration, a region having no boundary portion between the IGBT and diode will be disposed between the IGBT element region and the first electric current detection region. As a result, instability in the IGBT detection electric current that flows through the first electric current detection region can be suppressed, and the ratio between the IGBT main electric current and the IGBT detection electric current can be stabilized. The accuracy with which the IGBT electric current is detected can hereby be increased.

With this semiconductor device, a second electric current detection region capable of detecting the diode electric current that flows through the diode element region (diode main electric current) may also be formed in the semiconductor substrate. A first conductivity type cathode region, a first conductivity type drift region, and a second conductivity type body region are sequentially laminated in the second electric current detection region. In addition, the second electric current detection region is preferably arranged adjacent to the diode element region, and the cathode region of the diode element region preferably extends to connect with the cathode region of the second electric current detection region.

According to this configuration, a region having no boundary portion between the IGBT and diode will be disposed between the diode element region (i.e., the region in which the diode main electric current flows) and the second electric current detection region. As a result, instability in the diode detection electric current that flows through the second electric current detection region can be suppressed, and the ratio between the diode main electric current and the diode detection electric current can be stabilized. As a result, the accuracy with which the diode electric current is detected can hereby be increased.

With this semiconductor device, the second electric current detection region may be arranged adjacent to the first electric current detection region.

In the reverse conducting semiconductor device, the IGBT electric current and the diode electric current do not flow simultaneously. Thus, if the first electric current detection region and the second electric current detection region are mutually adjacent to each other, the respective detection electric current for the aforesaid currents can be obtained even if the first and second electric current detection regions are in contact with a single surface electrode (e.g., an electrode pad). According to this, the wiring of the detection portion can be simplified.

If the second electric current detection region is arranged adjacent to the first electric current detection region, an inactive region may further be formed between the first electric current detection region and the second electric current detection region.

Furthermore, the collector region of the first electric current detection region and the cathode region of the second electric current detection region may respectively extend to the inactive region.

Because of the presence of the inactive region that does not allow electricity to be conducted to the boundary portion of the first electric current detection region and the second electric current detection region, unstable IGBT electric current and diode electric current will not flow into the first and second electric current detection regions. Because of this, the ratio between the main electric current and the detection electric current can be made substantially constant, and electric current detection can be performed with a higher degree of accuracy.

The technique disclosed herein is effective even in a case where the diode main electric current is to be detected by the first electric current detection region in addition to the IGBT main electric current. In this case, a first conductivity type cathode region, a first conductivity type drift region, and a second conductivity type body region are sequentially laminated in a portion of the first electric current detection region in which a collector region is not formed. In addition, the first electric current detection region is preferably arranged adjacent to the diode element region, and the cathode region of the diode element region preferably extends to connect with the cathode region of the first electric current detection region.

According to the construction noted above, in addition to the IGBT electric current, the diode electric current can also be detected with good accuracy by utilizing the first electric current detection region. Compared to when two electric current detection regions are used to detect the IGBT electric current and the diode electric current, the space taken up by the electric current detection regions can be reduced.

The technique disclosed herein is also effective when only the diode electric current detection region capable of detecting the diode electric current is formed in the semiconductor substrate. In this case, like with the diode element region, the first conductivity type cathode region, the first conductivity type drift region, and the second conductivity type body region are sequentially laminated in the diode electric current detection region. Furthermore, the diode electric current detection region is arranged adjacent to the diode element region, and the cathode region of the diode element region extends to connect with the cathode region of the diode electric current detection region. Because of this, the accuracy with which the diode electric current is detected can be improved.

BEST MODE FOR CARRYING OUT THE INVENTION

Embodiment 1

Figure 1:
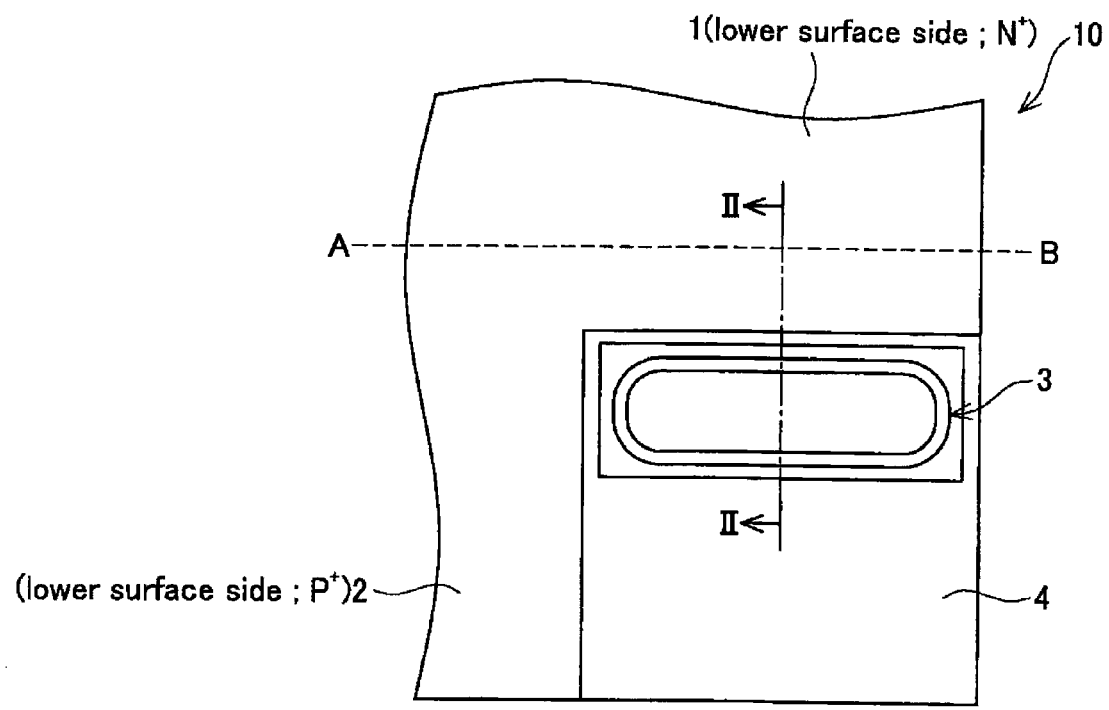
FIG. 1 shows a schematic plan view of a semiconductor device of Embodiment 1.
Figure 2:
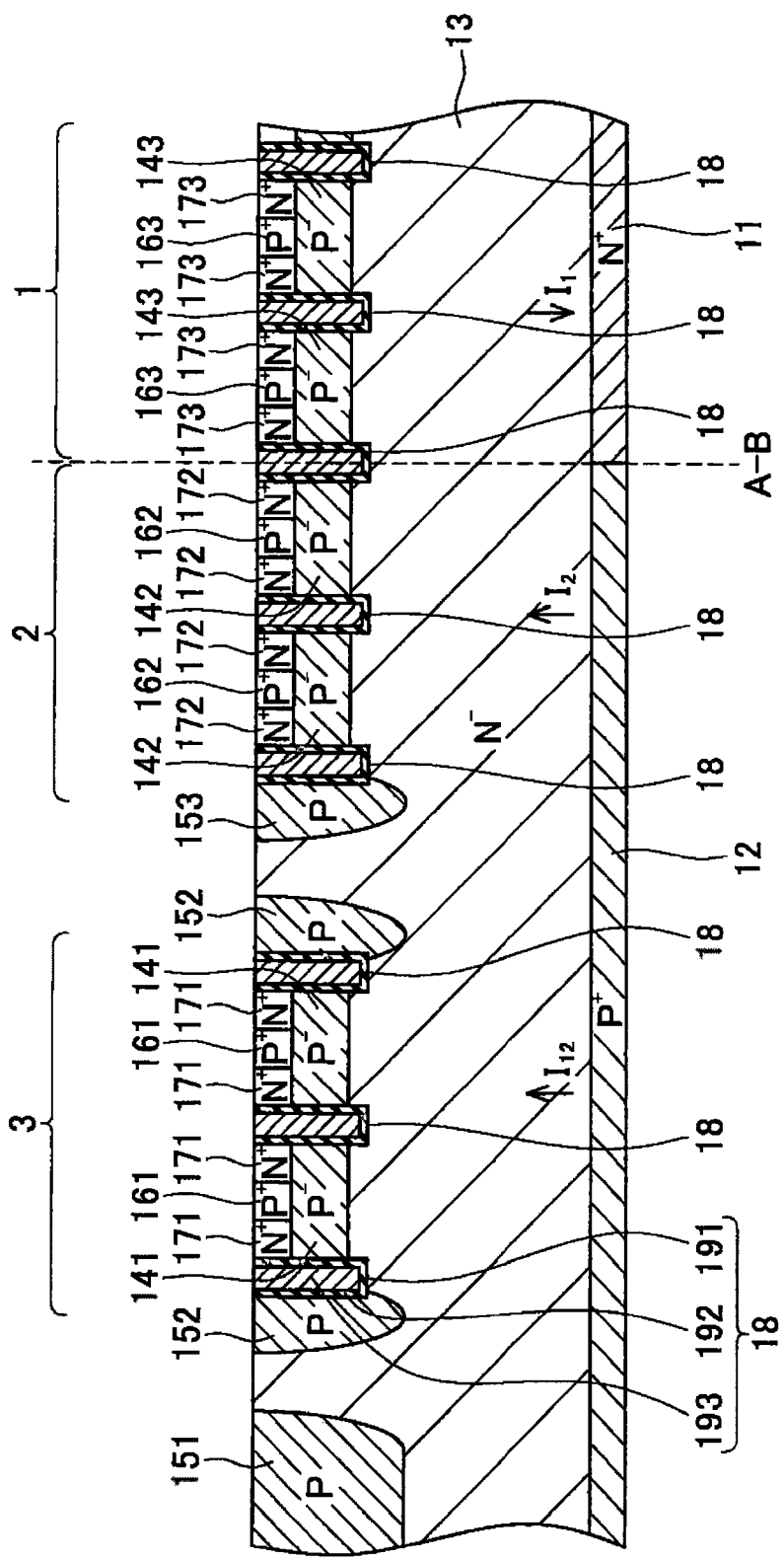
FIG. 2 shows a schematic cross-sectional view along line II-II of FIG. 1.

Embodiment 1 of the present teachings will be explained with reference to the drawings. FIG. 1 is a schematic plan view of a semiconductor device 100, and shows the area around a boundary portion between a main active region and an electric current detection region. FIG. 2 is a schematic expanded cross-sectional view along line II-II of FIG. 1.

As shown in FIGS. 1 and 2, the semiconductor device 100 comprises a diode main region 1, an IGBT main region 2, an electric current detection region 3, and a diffusion layer region 4 that are formed in a semiconductor substrate 10. The semiconductor substrate 10 comprises a first $N^+$ layer 11; a first $P^+$ layer 12 adjacent to the first $N^+$ layer 11; an $N^-$ layer 13 formed on the surfaces of the first $N^+$ layer 11 and the first $P^+$ layer 12; and $N^-$ layers 141, 142, 143 and P layers 151, 152, 153 formed on the surface of the $N^-$ layer 13. Second $P^+$ layers 161, 162, 163 and second $N^+$ layers 171, 172, 173 are respectively arranged on the surface of the $P^-$ layers 141, 142, 143. The P layers 151-153 are formed to deeper positions in the semiconductor substrate 10 than the $P^-$ layers 141-143.

A plurality of trench gates 18 are arranged from the upper surface of the semiconductor substrate 10 toward the $N^-$ layer 13. The depth of the trench gates 18 is deeper than the $P^-$ layers 141-143, and shallower than the P layers 151-153. The trench gates 18 comprise a gate insulating film 192 formed inside a trench 191, and a gate electrode 193 that fills the interior thereof. The second N⁺ layers 171, 172, 173 are in contact with the trench gates 18.

As shown in FIGS. 1 and 2, the diode main region 1 is a main active region of the first N⁺ layer 11 on an upper surface side thereof. The first N⁺ layer 11 can be used as a cathode region, the N⁻ layer 13 and the P⁻ layer 143 can be used as conductive regions, and the second P⁺ layer 163 can be used as an anode region.

The IGBT main region 2 is a main active region of the first P⁺ layer 12 on an upper surface side thereof. The first P⁺ layer 12 can be used as a collector region, the N⁻ layer 13 can be used as a drift region, the P⁻ layer 142 can be used as a body region, the second N⁺ layer 172 can be used as an emitter region, and the second P⁺ layer 162 can be used as a body contact region. In other words, the semiconductor device 100 is a reverse conducting semiconductor device comprising, in one semiconductor substrate, an IGBT element region having a collector region (the first P⁺ layer 12) on the bottom layer of the semiconductor substrate 10, and a diode element region having a cathode region (the first N⁺ layer 11) on the bottom layer of the semiconductor substrate 10.

The boundary between the diode main region 1 and the IGBT main region 2 is a boundary between the first N⁺ layer 11 and the first P⁺ layer 12 formed in the lower surface side of the semiconductor substrate 10, and is shown as broken line AB in FIG. 1 and FIG. 2. The boundary between the IGBT and the diode formed in the semiconductor device 100 coincides with the boundary between the collector region (first P⁺ layer 12) and the cathode region (first N⁺ layer 11). As shown in FIGS. 1 and 2, with the diode main region 1 and the IGBT main region 2, the N⁻ layer 13 of the semiconductor substrate 10 and the layers formed on the surface thereof (the layers on the surface side of the N⁻ layer 13) are constructed identically with respect to each other, and only the layer on the lower surface side of the N⁻ layer 13 (i.e., the first N⁺ layer 11 and the first P⁺ layer 12, respectively) differ in the diode main region 1 and the IGBT main region 2. In other words, with the main active region of the semiconductor device 100, when the layer on the lower surface side of the semiconductor substrate 10 is the first N⁺ layer 11, the main active layer can be used as the diode main region 1, and when the layer on the lower surface side of the semiconductor device 10 is the first P⁺ layer 12, the main active layer can be used as the IGBT main region 2.

Like with the IGBT main region 2, the electric current detection region 3 is arranged in the first P⁺ layer 12 on the upper surface side thereof. As shown in FIGS. 1 and 2, the electric current detection region 3 is arranged adjacent to the IGBT main region 2, and the collector region of the IGBT main region 2 and the collector region of the electric current detection region 3 are formed integrally as one layer (the first P⁺ layer 12). The construction of the upper surface side of the N⁻ layer 13 of the electric current detection region 3 is identical to those of the diode main region 1 and the IGBT main region 2. In other words, the electric current detection region 3 is an IGBT; whereas the first P⁺ layer 12 can be used as a collector region, the N⁻ layer 13 can be used as a drift region, the P⁻ layer 141 can be used as a body region, the second N⁺ layer 171 can be used as an emitter region, and the second P⁺ layer 161 can be used as a body contact region.

The electric current detection region 3 is surrounded by the P layer 152. The boundary between the first P⁺ layer 12 and the first N⁺ layer 11 (broken line AB) is located outside the P layer 152 formed around the perimeter of the electric current detection region 3, and is in between the diode main region 1 and the IGBT main region 2. The boundary between the first P⁺ layer 12 and the first N⁺ layer 11 (broken line AB) does not exist between the electric current detection region 3 and the IGBT main region 2.

The diffusion layer region 4 is positioned around the perimeter of the electric current detection region 3, and comprises the P layers 151, 152 (deep diffusion layers). The P layers 151, 152 are inactive regions that do not contribute to electric conductivity, and the movement of carriers between the electric current detection region 3 and the diode main region 1 as well as the IGBT main region 2 can be inhibited by these inactive regions.

The first N⁺ layer 11 and the first P⁺ layer 12 connect to a lower surface electrode (not illustrated), the second N⁺ layers 172, 173 and the second P⁺ layers 162, 163 connect to a main surface electrode (not illustrated), and the second N⁺ layer 171 and the second P⁺ layer 161 connect to a detection surface electrode (not illustrated).

In the IGBT main region 2, when the electrical potential Va of the lower surface electrode is higher than the electrical potential Vb of the main surface electrode and the electrical potential Vc of the detection surface electrode (Va>Vb, Vc), and a positive voltage (positive bias) is applied to the gate electrode 193, a channel is formed in the P⁻ layer 142 (body region) in the area near the trench gate 18, and an IGBT main electric current $I_2$ will flow from the first P⁺ layer 12 (the collector region) to the second N⁺ layer 172 (the emitter region). Electric current will not flow through the diode main region 1.

In contrast, in the diode main region 1, when the electrical potential Va of the lower surface electrode is lower than the electrical potential Vb of the main surface electrode and the electrical potential Vc of the detection surface electrode (Va<Vb, Vc), a diode main electric current $I_1$ will flow from the second P⁺ layer 163 (the anode region) to the first N⁺ layer 11 (the cathode region) via the N⁻ layer 13 and the P⁻ layer 143. Electric current will not flow through the IGBT main region 2.

Because the electric current detection region 3 is positioned in the first P⁺ layer 12 on the upper surface side thereof in the same way as the IGBT main region 2, electric current will flow through the electric current detection region 3 in the same way as the IGBT main region 2. Almost no electric current will flow through the electric current detection region 3 when Va<Vb, Vc, but IGBT detection electric current $I_{12}$ will flow from the first P⁺ layer 12 (the collector region) to the second N⁺ layer 171 (emitter region) when Va>Vb, Vc. In the present embodiment, the boundary between the first P⁺ layer 12 and the first N⁺ layer 11 (broken line AB) does not exist between the electric current detection region 3 and the IGBT main region 2. In this configuration, the effect of the boundary between the first P⁺ layer 12 (collector region) and the first N⁺ layer 11 (cathode region) with respect to the IGBT detection electric current $I_{12}$ of the electric current detection region 3 can be minimized, and the IGBT detection electric current $I_{12}$ can be stabilized.

As noted above, in the present embodiment, the first electric current detection region capable of detecting the IGBT electric current is arranged adjacent to the IGBT main region, and the collector region of the IGBT main region extends to connect with the collector region of the first electric current detection region. In this configuration, the IGBT detection electric current that flows through the first electric detection region can be stabilized. In particular, because the boundary between the IGBT and the diode (broken line AB) is not positioned on the lower layer of the electric current detection region, the ratio between the IGBT main electric current that flows through the IGBT main region and the IGBT detection electric current that flows through the electric current detection region will be stabilized. If the electric current detection region is used as the IGBT electric current detection region, the IGBT main electric current can be detected with good accuracy.

Note that the ratio $I_{12}/I_2$ between the IGBT detection electric current $I_{12}$ and the IGBT main electric current $I_2$ is dependant upon the ratio $S_{12}/S_2$ between the area $S_2$ of the IGBT main region 2 and the area $S_{12}$ of the electric current detection region 3 on the surface of the substrate. By adjusting the area ratio $S_{12}/S_2$, the ratio $I_{12}/I_2$ between the IGBT detection electric current $I_{12}$ and the IGBT main electric current $I_2$ can be adjusted.

Embodiment 2

Figure 3:
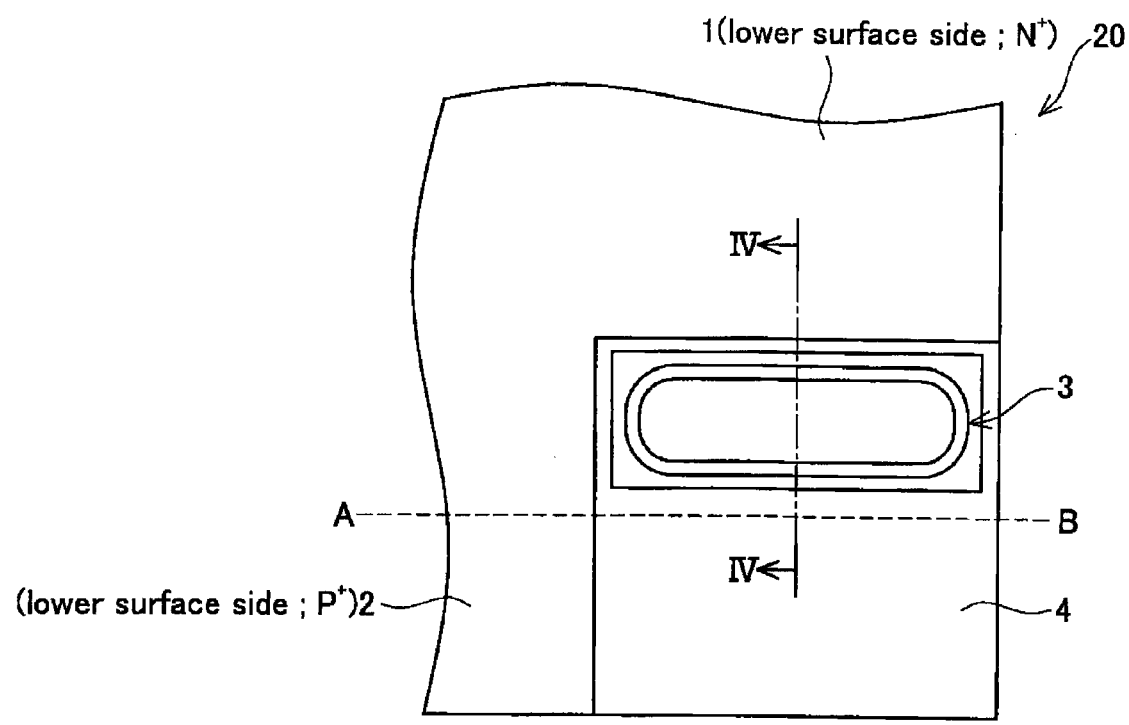
FIG. 3 shows a schematic plan view of a semiconductor device of Embodiment 2.
Figure 4:
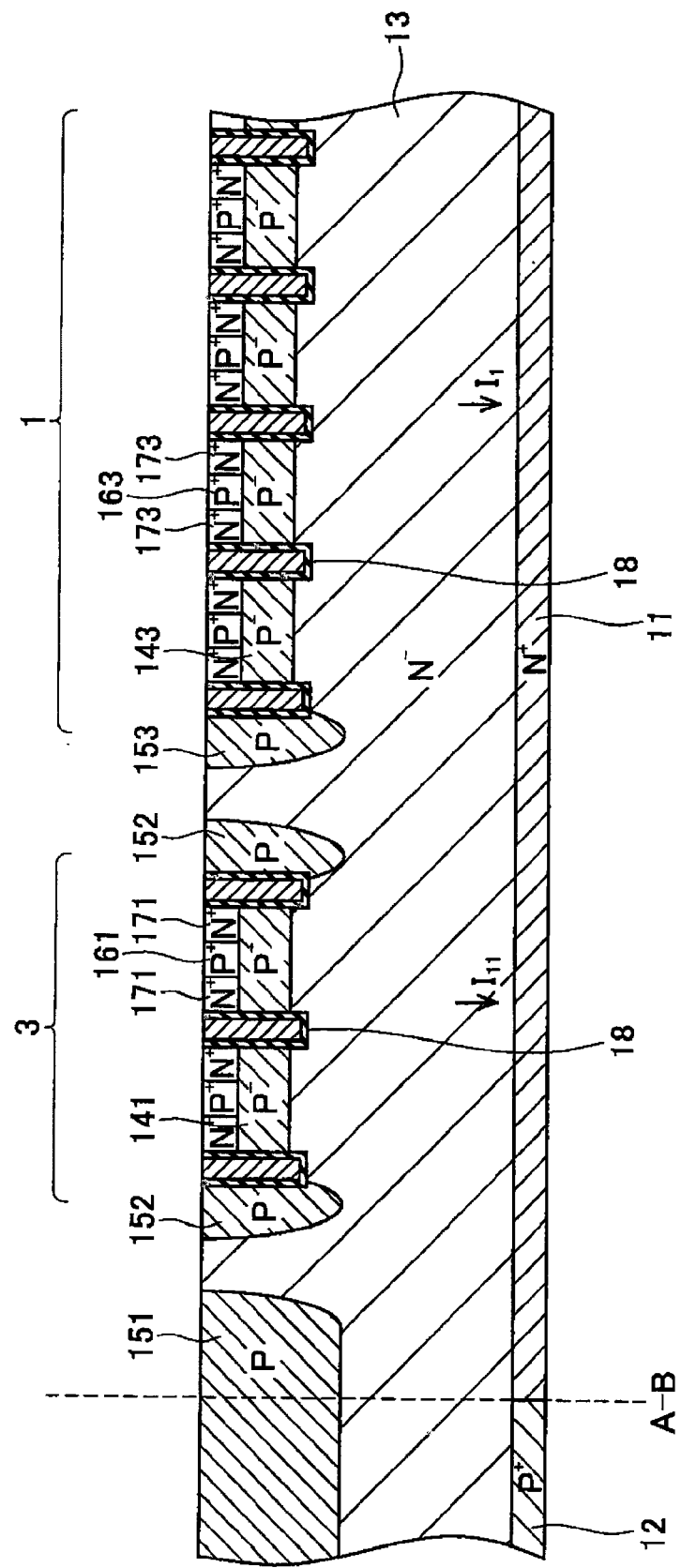
FIG. 4 shows a schematic cross-sectional view along line IV-IV of FIG. 3.

FIG. 3 is a schematic plan view of a semiconductor device 200 according to the present embodiment, and shows the area around a boundary portion between a main active region and an electric current detection region on a semiconductor substrate. FIG. 4 is a schematic expanded cross-sectional view along line IV-IV of FIG. 3.

With the semiconductor device 200, the position of the boundary (broken line AB) between the first P$^+$ layer 12 and the first N$^+$ layer 11 formed in the lower surface side of the semiconductor substrate 20 differs from that of the semiconductor device 100. In the main active region, the region comprising the first N$^+$ layer 11 and the layers formed on the surface thereof becomes the diode main region 1, and the region comprising the first P$^+$ layer 12 and the layers formed on the surface thereof becomes the IGBT active region 2. Like with the diode main region 1, the electric current detection region 3 is arranged in the first N$^+$ layer 11 on the upper surface side thereof. Since the other structures are identical with those of the semiconductor device 100, duplicate explanation thereof will be omitted. In addition, the detailed constructions of the layers on the surface side of the N$^-$ layer 13 in FIG. 4 are omitted from the drawing.

In the present embodiment, as shown in FIGS. 3 and 4, the electric current detection region 3, like the diode main region 1, is arranged in the first N$^+$ layer 11 on the upper surface side thereof. The electric current detection region 3 is arranged adjacent to the diode main region 1, and the cathode region of the diode main region 1 and the cathode region of the electric current detection region 3 are formed integrally as one layer (the first N$^+$ layer 11). The construction of the layers on the surface side of the N$^-$ layer 13 of the electric current detection region 3 is identical to that of the diode main region 1. In other words, the electric current detection region 3 is a diode; whereas the first N$^+$ layer 11 will be used as a cathode region, the N$^-$ layer 13 and the P$^-$ layer 141 will be used as conductive regions, and the second P$^+$ layer 161 will be used as an anode region.

The boundary between the first P$^+$ layer 12 and the first N$^+$ layer 11 (broken line AB) is located outside the P layer 152 formed around the perimeter of the electric detection region 3, and is in between the diode main region 1 and the IGBT main region 2. The boundary between the first P$^+$ layer 12 and the first N$^+$ layer 11 (broken line AB) does not exist between the electric detection region 3 and the diode main region 1. Like in Embodiment 1, with the semiconductor 200, the boundary between the IGBT and diode coincides with the boundary between the collector region (first P$^+$ layer 12) and the cathode region (first N$^+$ layer 11).

Like with Embodiment 1, the first N$^+$ layer 11 and the first P$^+$ layer 12 connect to the lower surface electrode of the semiconductor device 200, while the second N$^+$ layers 173 and the second P$^+$ layers 163 of the diode main region 1 as well as the second N$^+$ layers 172 and the second P$^+$ layers 162 of the IGBT main region 2 connect to a main surface electrode. The second N$^+$ layer 171 and the second P$^+$ layer 161 of the electric current detection region 3 connect to a detection surface electrode.

When the electrical potential Va of the lower surface electrode is lower than the electrical potential Vb of the main surface electrode and the electrical potential Vc of the detection surface electrode (Va<Vb, Vc), the diode main electric current $I_1$ will flow in the diode main region 1, while no electric current will flow in the IGBT main region 2.

In contrast, when the electrical potential Va of the lower surface electrode is higher than the electrical potential Vb of the main surface electrode and the electrical potential Vc of the detection surface electrode, the IGBT main electric current $I_2$ will flow in the IGBT main region 2 when a positive voltage (positive bias) is applied to the gate electrode (Va>Vb, Vc), while no electric current will flow in the diode main region 1.

Because the electric current detection region 3 is positioned in the first N$^+$ layer 11 on the upper surface side thereof in the same way as the diode main region 1, electric current $I_{11}$ (a diode detection electric current) will flow in the same way as in the diode main region 1 when Va<Vb, Vc. Almost no electric current will flow when Va>Vb, Vc. In the present embodiment, the boundary between the first P$^+$ layer 12 and the first N$^+$ layer 11 (broken line AB) does not exist between the electric current detection region 3 and the diode main region 1. According to this, the effect of the boundary between the first P$^+$ layer 12 (collector region) and the first N$^+$ layer 11 (cathode region) on the diode detection electric current $I_{11}$ of the electric current detection region 3 can be minimized, and the diode detection electric current $I_{11}$ can be stabilized.

As noted above, in the present embodiment, the electric current detection region capable of detecting the diode electric current is arranged adjacent to the diode main region, and the cathode region of the diode main region extends to connect with the cathode region of the electric current detection region. In this way, the diode detection electric current that flows through the electric current detection region can be stabilized. In particular, because the boundary between the IGBT and the diode (broken line AB) is not positioned on the bottom layer of the electric current detection region, the ratio between the diode main electric current that flows through the diode main region and the diode detection electric current that flows through the electric current detection region will be stabilized. If the electric current detection region is used as the diode electric current detection region, the diode main electric current can be detected with good accuracy.

Note that the ratio $I_{11}/I_1$ between the diode detection electric current $I_{11}$ and the diode main electric current $I_1$ is dependant upon the ratio $S_{11}/S_1$ between the area $S_1$ of the diode main region 1 and the area $S_{11}$ of the electric current detection region on the surface of the substrate. By adjusting the area ratio $S_{11}/S_1$, the ratio $I_{11}/I_1$ between the diode detection electric current $I_{11}$ and the diode main electric current $I_1$ can be adjusted.

Note that the techniques disclosed in Embodiments 1 and 2 noted above can of course be used in combination.

Embodiment 3

Figure 5:
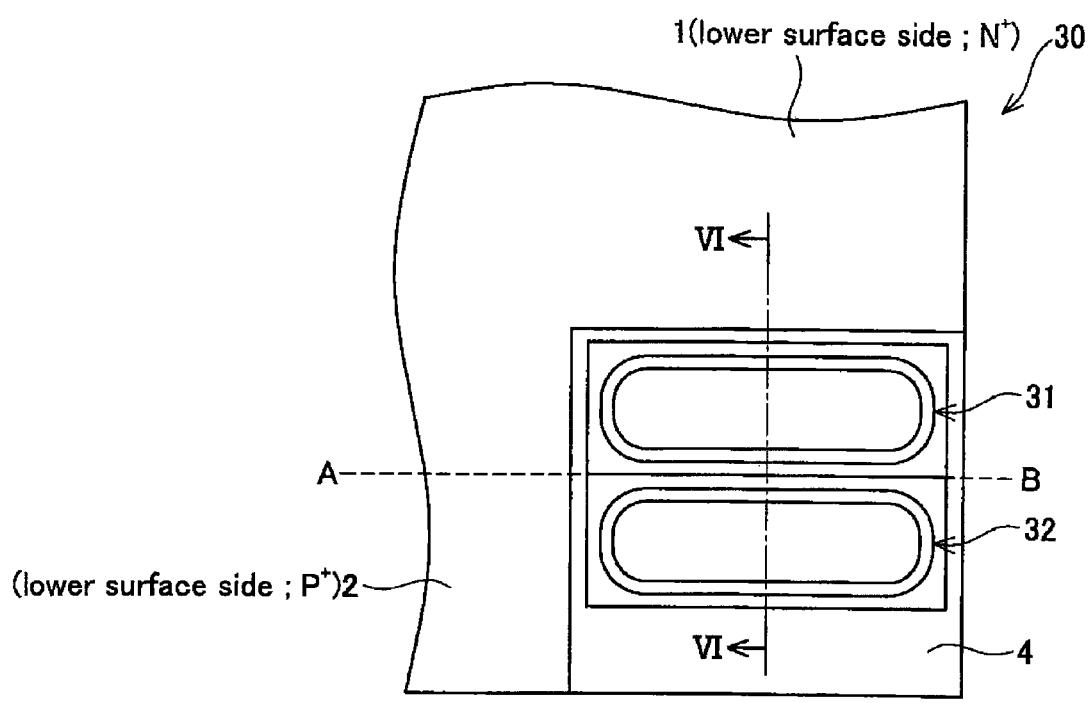
FIG. 5 shows a schematic plan view of a semiconductor device of Embodiment 3.
Figure 6:
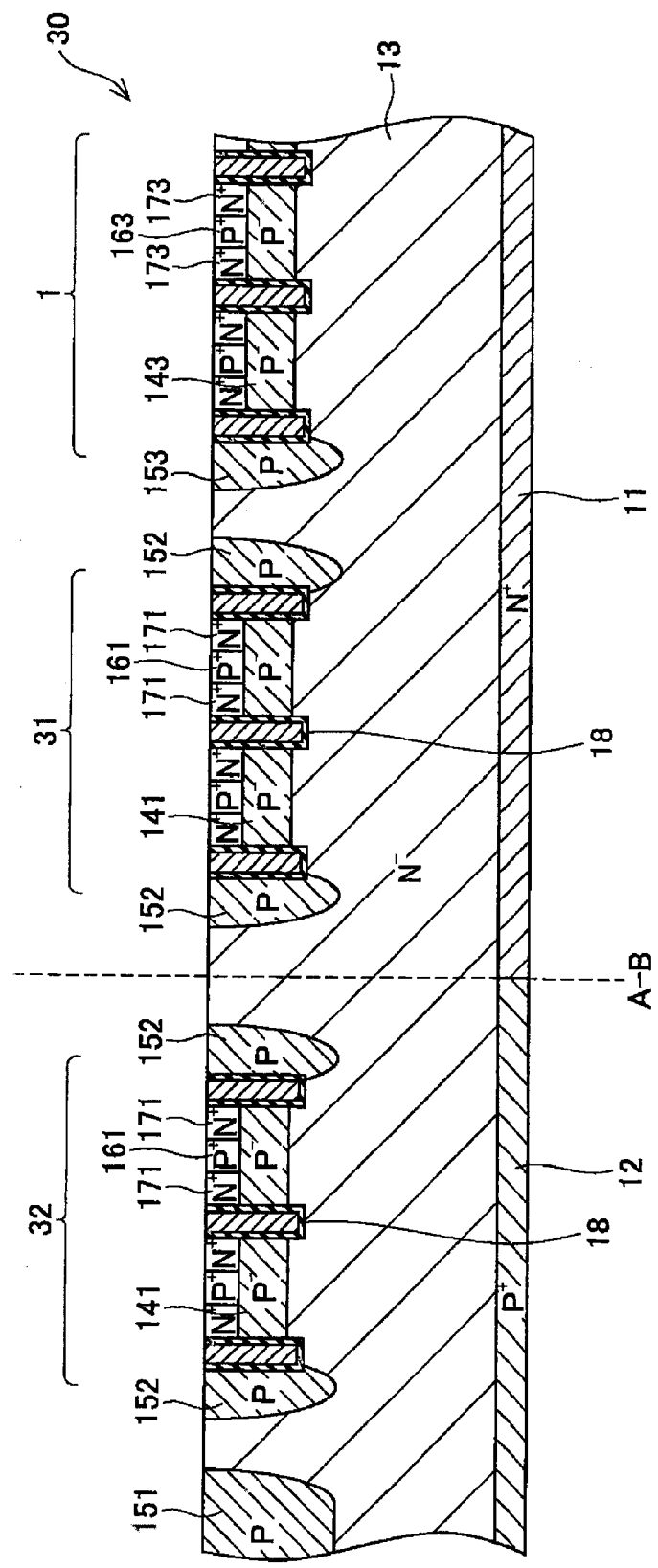
FIG. 6 shows a schematic cross-sectional view along line VI-VI of FIG. 5.

FIG. 5 is a schematic plan view of a semiconductor device 300 according to the present embodiment, and shows the area around a boundary portion between a main active region and an electric current detection region on a semiconductor substrate. FIG. 6 is a schematic expanded cross-sectional view along line VI-VI of FIG. 5.

As shown in FIGS. 5 and 6, an electric current detection region 31 and an electric current detection region 32 are located on the semiconductor device 300. In addition, the boundary (broken line AB) between the first P+ layer 12 and the first N+ layer 11 formed in the lower surface side of the semiconductor substrate 30 is positioned on an inactive region between the electric current detection region 31 and the electric current detection region 32. The electric current detection region 31 and the electric current detection region 32 are respectively surrounded by the P layer 152 like with the electric current detection region 3 of Embodiment 1. Because the other structures are identical with the semiconductor device 100, duplicate explanation thereof will be omitted. In addition, the detailed constructions of the layers on the surface side of the N− layer 13 in FIG. 6 are omitted from the drawing.

In the present embodiment, as shown in FIGS. 5 and 6, the electric current detection region 31 and the electric current detection region 32 are located adjacent to each other. The electric current detection region 31, like with the diode main region 1, is located on the upper surface side of the first N+ layer 11, and the electric current detection region 32, like with the IGBT main region 2, is located on the upper surface side of the first P+ layer 12. In other words, a diode is formed in the electric current detection region 31, and an IGBT is formed in the electric current detection region 32.

A portion of the boundary (broken line AB) between the first P+ layer 12 and the first N+ layer 11 is positioned on a region between the electric current detection region 31 and the electric current detection region 32. In the region between the electric current detection region 31 and the electric current detection region 32, only the N− layer 13 and the P layer 152 are provided above the boundary portion between the first P+ layer 12 and the first N+ layer 11, and thus becomes an inactive region which does not become electrically conductive. The electric current detection region 31 and the electric current detection region 32 are provided in a position that faces the boundary between the first P+ layer 12 and the first N+ layer 11. The electric current detection region 31 is arranged adjacent to the diode main region 1, and the cathode region of the diode main region 1 and the cathode region of the electric current detection region 3 are formed integrally as one layer (the first N+ layer 11). The electric current detection region 32 is arranged adjacent to the IGBT main region 2, and the collector region of the IGBT main region 2 (not illustrated in FIG. 6) and the collector region of the electric current detection region 3 are formed integrally as one layer (the first P+ layer 12). The boundary between the IGBT and diode in the semiconductor device 300 coincides with the boundary between the collector region (first P+ layer 12) and the cathode region (first N+ layer 11).

Like with Embodiments 1 and 2, the first N+ layer 11 and the first P+ layer 12 connect to the lower surface electrode of the semiconductor device 300, while the second N+ layers 173 and the second P+ layers 163 of the diode main region 1 as well as the second N+ layers 172 and the second N+ layers 162 of the IGBT main region 2 connect to the main surface electrode. The second N+ layer 171 and the second P+ layer 161 of the electric current detection region 31 and the electric current detection region 32 connect to the detection surface electrode. Because the electric current detection region 31 and the electric current detection region 32 are located adjacent to each other, they can, for example, be connected by means of one electrode pad.

When the electrical potential Va of the lower surface electrode is lower than the electrical potential Vb of the main surface electrode and the electrical potential Vc of the detection surface electrode (Va<Vb, Vc), the diode main electric current $I_1$ will flow in the diode main region 1 while no electric current will flow in the IGBT main region 2. Likewise, the diode detection electric current $I_{11}$ will flow to the electric current detection region 31, but almost no electric current will flow to the electric current detection region 32. Like with Embodiment 2, because the boundary between the first P+ layer 12 and the first N+ layer 11 (broken line AB) does not exist between the electric current detection region 31 and the diode main region 1, the diode detection electric current $I_{11}$ that flows to the electric current detection region 31 can be stabilized.

In contrast, when the electrical potential Va of the lower surface electrode is higher than the electrical potential Vb of the main surface electrode and the electrical potential Vc of the detection surface electrode (Va>Vb, Vc), and a positive voltage (positive bias) is applied to the gate electrode, the IGBT main electric current $I_2$ will flow in the IGBT main region 2 while no electric current will flow in the diode main region 1. Likewise, the IGBT detection electric current $I_{12}$ will flow to the electric current detection region 32, but almost no electric current will flow to the electric current detection region 31. Like with Embodiment 1, the boundary between the first P+ layer 12 and the first N+ layer 11 (broken line AB) does not exist between the electric current detection region 32 and the IGBT main region 2. Because of this, the IGBT detection electric current $I_{12}$ that flows through the electric current detection region 32 can be stabilized.

In the present embodiment, the electric current detection region 31 that detects the diode main electric current is located adjacent to the electric current detection region 32 that detects the IGBT main electric current, and both regions are connected to one detection surface electrode. In this configuration, the wiring of the electric current detection regions can be simplified.

In addition, in the present embodiment, the inactive region is formed between the electric current detection region 31 (i.e., the diode electric current detection region) and the electric current detection region 32 (i.e., the IGBT electric current detection region). In other words, the first P+ layer 12 (the collector region) of the electric current detection region 32 and the first N+ layer 11 (the cathode region) of the electric current detection region 31 respectively extend to the inactive region. Because the inactive region that does not become electrically conductive is located above the boundary between the first P+ layer (collector region) and the first N+ layer (cathode region) at which the IGBT electric current and the diode electric current become unstable, the accuracy with which the IGBT detection electric current and the diode detection electric current is measured can be further improved.

Figure 7:
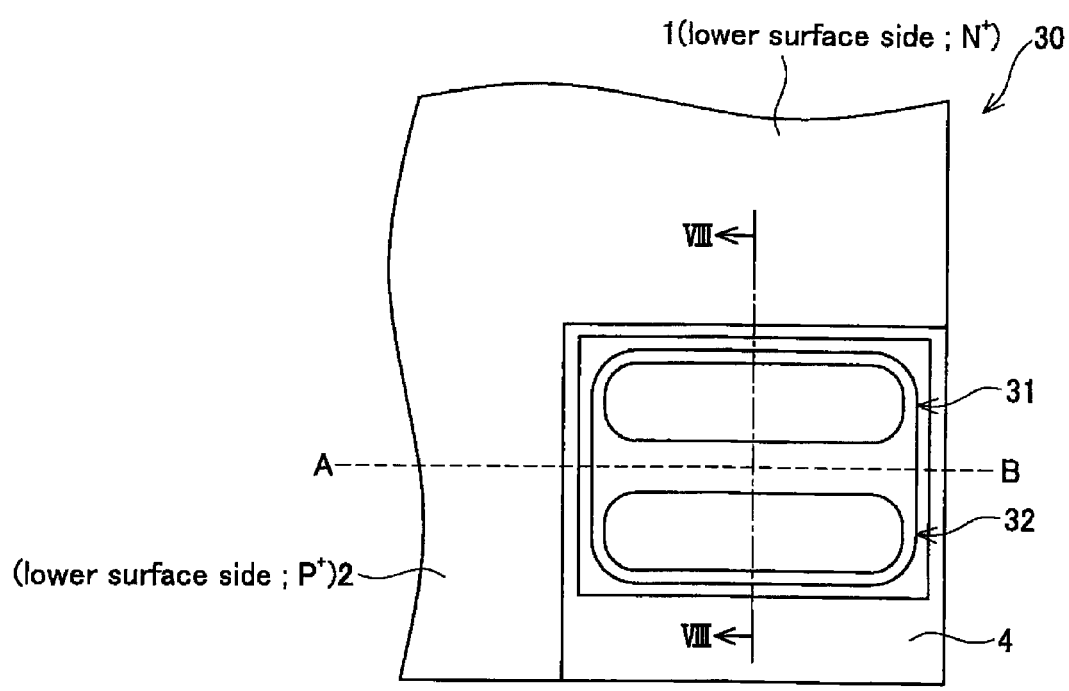
FIG. 7 shows a schematic plan view of a variant semiconductor device.
Figure 8:
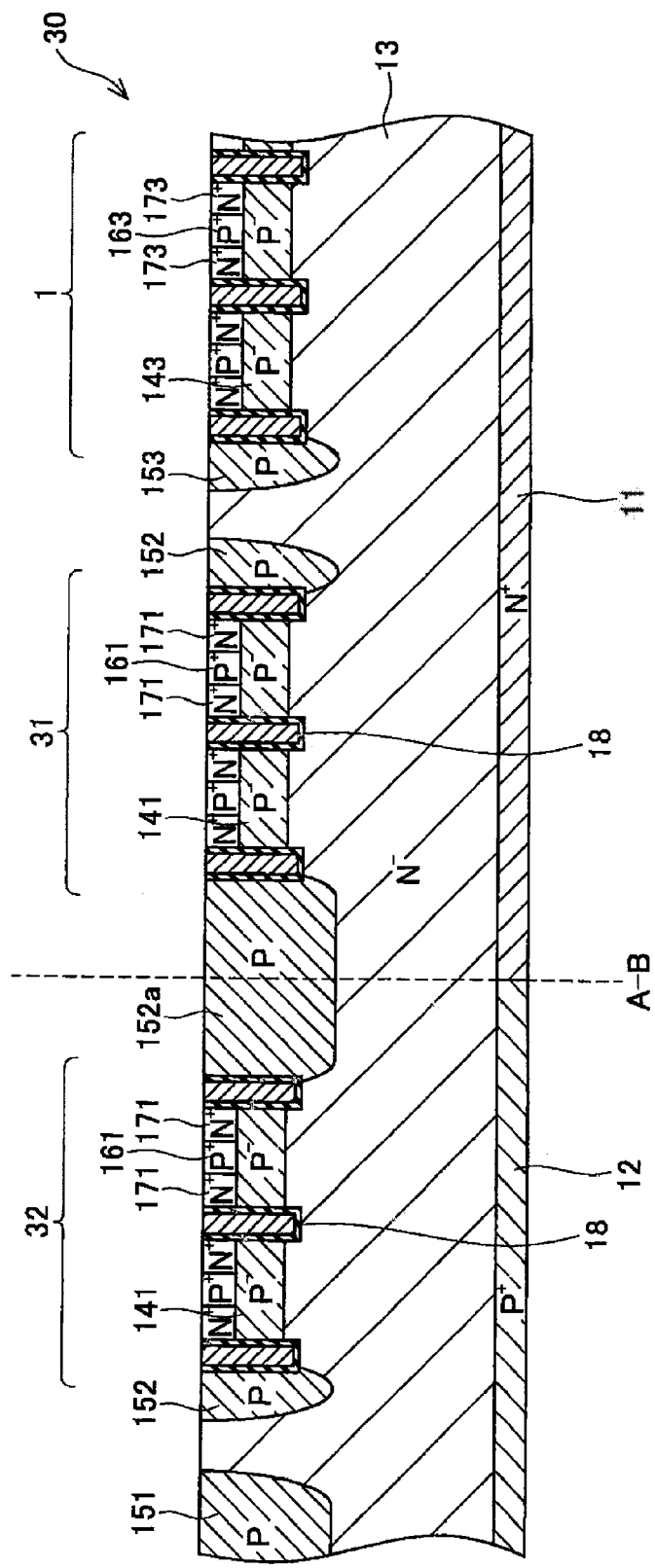
FIG. 8 shows a schematic cross-sectional view along line VIII-VIII of FIG. 7.

Note that, as shown in FIGS. 7 and 8, a P layer 152a may be formed over the entire surface side of the N− layer 13 in the region between the electric current detection region 31 and the electric current detection region 32. Because the electric current detection region 31 is separated from the electric current detection region 32 by means of one P layer, the distance between the electric current detection region 31 and the electric current detection region 32 can be shortened. In this case, the boundary (broken line AB) between the first P+ layer 12 and the first N+ layer 11 is preferably designed so as to be located approximately in the center of the P layer 152a. Even if variations occur in the position of the boundary between the first P+ layer 12 and the first N+ layer 11 during mass production, robustness can be improved because the boundary between the first P⁺ layer 12 and the first N⁺ layer 11 can be placed below the P layer 152a (the inactive region).

Figure 9:
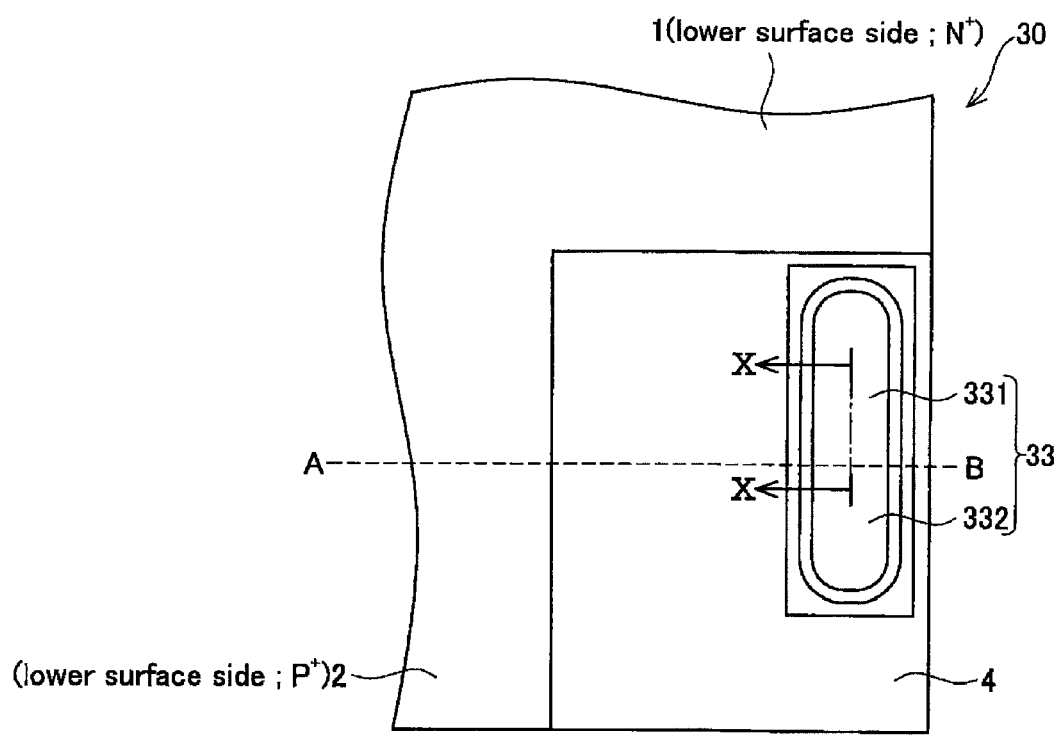
FIG. 9 shows a schematic plan view of another variant semiconductor device.
Figure 10:
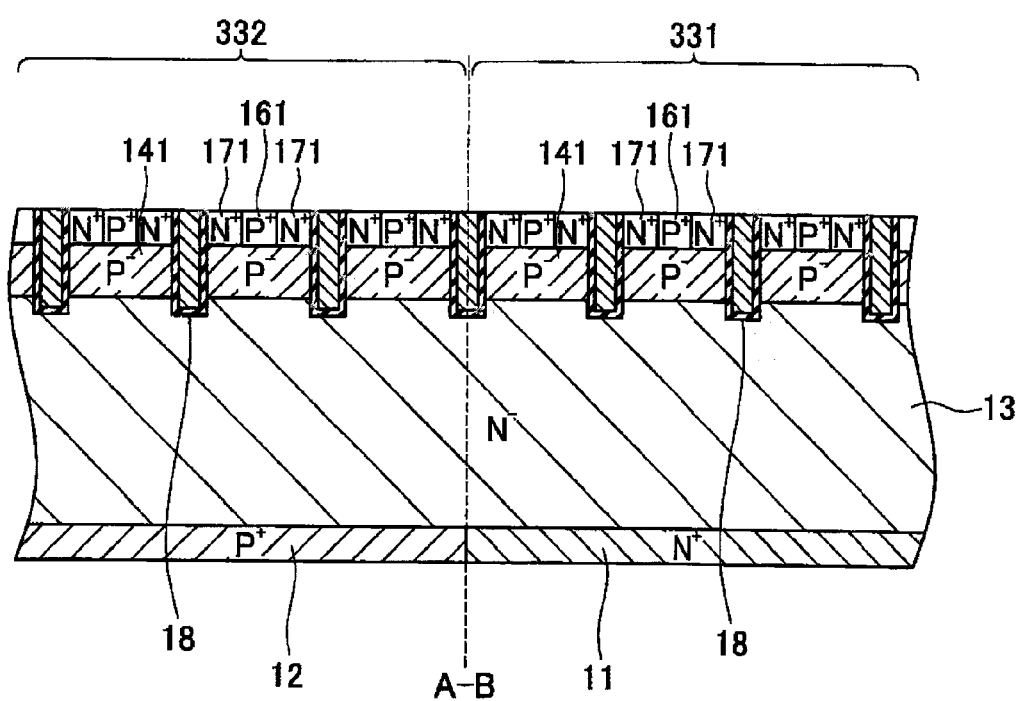
FIG. 10 shows a schematic cross-sectional view along line X-X of FIG. 9.

In addition, in the aforementioned embodiment, the electric current detection region 32 that detects the IGBT main electric current is located apart from the electric current detection region 31 that detects the diode main electric current. However, as shown in FIGS. 9 and 10, the IGBT electric current detection portion that detects the IGBT main electric current and the diode electric current detection portion that detects the diode main electric current may be located in the same electric current detection region. In an electric current detection region 33, an upper layer portion of the cathode region thereof (the first N⁺ layer 11) is a diode electric current detection portion 331, and an upper layer portion of the collector region thereof (the first P⁺ layer 12) is an IGBT electric current detection portion 332. Compared to when two electric current detection regions are used to detect the IGBT electric current and the diode electric current, the space taken up by the electric current detection region can be reduced. Note that when the diode electric current and the IGBT electric current is to be detected by means of one cell, as exemplified in FIGS. 9 and 10, the size of the boundary portion between the IGBT and the diode in the electric current detection region 33 is preferably set to be smaller than the size of the electric current detection region. Smaller the size of the boundary portion between the IGBT and the diode with respect to the size of the electric current detection region is more preferable. In this configuration, the effect of the boundary portion between the IGBT and the diode on the IGBT detection electric current and the diode detection electric current can be reduced.

According to Embodiments 1-3 of the present teachings, the accuracy with which the IGBT detection electric current and the diode detection electric current are detected by the electric current detection region can be improved in the semiconductor device having comprised of the IGBT element region and the diode element region in one semiconductor substrate.

Note that the semiconductor devices disclosed in Embodiments 1-3 can be manufactured by applying conventional technology used in the semiconductor manufacturing process. Because the semiconductor devices can be manufactured without making significant changes in the conventional semiconductor manufacturing process, it will be possible to manufacture the semiconductor devices without significant increases in the labor, cost and time involved in the manufacturing process.

Specific embodiments of the present teachings are described above, but are mere illustrations and do not restrict the claims. The art set forth in the claims includes variations and modifications of the specific examples set forth above.

The technological components described in the present specification or the drawings exhibit technological utility individually or in various combinations, and are not limited to the combinations disclosed in the claims at the time of application. Furthermore, the art disclosed herein may be utilized to simultaneously achieve a plurality of aims or to achieve one of these aims.

The invention claimed is:

1. A semiconductor device comprising:
at least one IGBT element region;
a diode element region; and
a diode electric current detection region configured capable of detecting a diode electric current that flows through the diode element region,
wherein the IGBT element region, the diode element region and the diode electric current detection region are formed in one semiconductor substrate,
a second conductivity type collector region, a first conductivity type drift region, and a second conductivity type body region are sequentially laminated in the IGBT element region,
a first conductivity type cathode region, a first conductivity type drift region, and a second conductivity type body region are sequentially laminated in the diode element region and the diode electric current detection region,
the diode electric current detection region is arranged adjacent to the diode element region,
the cathode region of the diode element region extends to connect with the cathode region of the diode electric current detection region,
the collector region of the IGBT element region is arranged adjacent to the cathode region of the diode element region, and
the diode element region is disposed between the diode electric current detection region and the IGBT element region so that the diode electric current detection region is not adjacent to any IGBT element region.

* * * * *

UNITED STATES PATENT AND TRADEMARK OFFICE
CERTIFICATE OF CORRECTION

PATENT NO. : 8,723,220 B2
APPLICATION NO. : 13/201791
DATED : May 13, 2014
INVENTOR(S) : Akitaka Soeno Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 124 days.

Signed and Sealed this
Twenty-ninth Day of September, 2015

Michelle K. Lee
*Director of the United States Patent and Trademark Office*